United States Patent
Kim et al.

(10) Patent No.: US 9,813,070 B2
(45) Date of Patent: Nov. 7, 2017

(54) DISPLAY APPARATUS AND DRIVING METHOD FOR THE SAME

(71) Applicant: POSTECH ACADEMY—INDUSTRY FOUNDATION, Pohang-si, Gyeongsangbuk-do (KR)

(72) Inventors: Jae Joon Kim, Pohang-si (KR); Doo Bock Lee, Seoul (KR); Jun Ki Park, Daegu (KR); Eun Woo Song, Daegu (KR)

(73) Assignee: POSTECH ACADEMY—INDUSTRY FOUNDATION, Pohang-si, Gyeongsangbuk-do (KR)

( * ) Notice: Subject to any disclaimer, the term of this patent is extended or adjusted under 35 U.S.C. 154(b) by 22 days.

(21) Appl. No.: 15/044,512

(22) Filed: Feb. 16, 2016

(65) Prior Publication Data
US 2016/0241251 A1 Aug. 18, 2016

(30) Foreign Application Priority Data
Feb. 16, 2015 (KR) .................. 10-2015-0023603

(51) Int. Cl.
G06F 3/038 (2013.01)
G09G 5/00 (2006.01)
H03L 7/089 (2006.01)
G09G 5/12 (2006.01)
G09G 3/20 (2006.01)
(Continued)

(52) U.S. Cl.
CPC ............. *H03L 7/0891* (2013.01); *G09G 3/20* (2013.01); *G09G 3/2092* (2013.01); *G09G 3/3674* (2013.01); *G09G 5/12* (2013.01); *H03L 7/0995* (2013.01); *H03L 7/235* (2013.01); *G09G 2310/0267* (2013.01); *G09G 2310/08* (2013.01);
(Continued)

(58) Field of Classification Search
CPC ....... G09G 2310/0267; G09G 2310/08; G09G 2330/021; G09G 2330/06; G09G 3/20; G09G 3/2092; G09G 3/3674; G09G 5/12; H03L 7/0891; H03L 7/0995; H03L 7/235
See application file for complete search history.

(56) References Cited

U.S. PATENT DOCUMENTS

| | | | |
|---|---|---|---|
| 7,532,195 B2 | 5/2009 | Sampsell | |
| 8,274,501 B2 | 9/2012 | Kwa et al. | |
| 2010/0156885 A1* | 6/2010 | Cho | ................ G09G 3/006 345/214 |

FOREIGN PATENT DOCUMENTS

| KR | 20100073718 A | 7/2010 |
|---|---|---|
| WO | 0249314 A2 | 6/2002 |

* cited by examiner

*Primary Examiner* — Insa Sadio
(74) *Attorney, Agent, or Firm* — Ladas & Parry LLP

(57) ABSTRACT

The present invention relates to a method for generating a reference signal to drive a display apparatus. A method according to the present invention may comprise generating a reference signal having a training pattern being repeated with a periodicity of two clock terms (CTs); and transmitting the reference signal to a phase locked loop (PLL). Each CT has a single embedded clock bit (CB) and a plurality of data bits, and the reference signal has a rising edge at a start point of a first CB corresponding to a first unit interval (UI) of a first CT, and a rising edge at an end point of a second CB corresponding to a first UI of a second CT. According to exemplary embodiments of the present disclosure, energy consumption and EMI effects can be remarkably reduced, and a complexity of PLL can be reduced.

12 Claims, 6 Drawing Sheets

(51) Int. Cl.
  *G09G 3/36* (2006.01)
  *H03L 7/099* (2006.01)
  *H03L 7/23* (2006.01)
(52) U.S. Cl.
  CPC ... *G09G 2330/021* (2013.01); *G09G 2330/06* (2013.01)

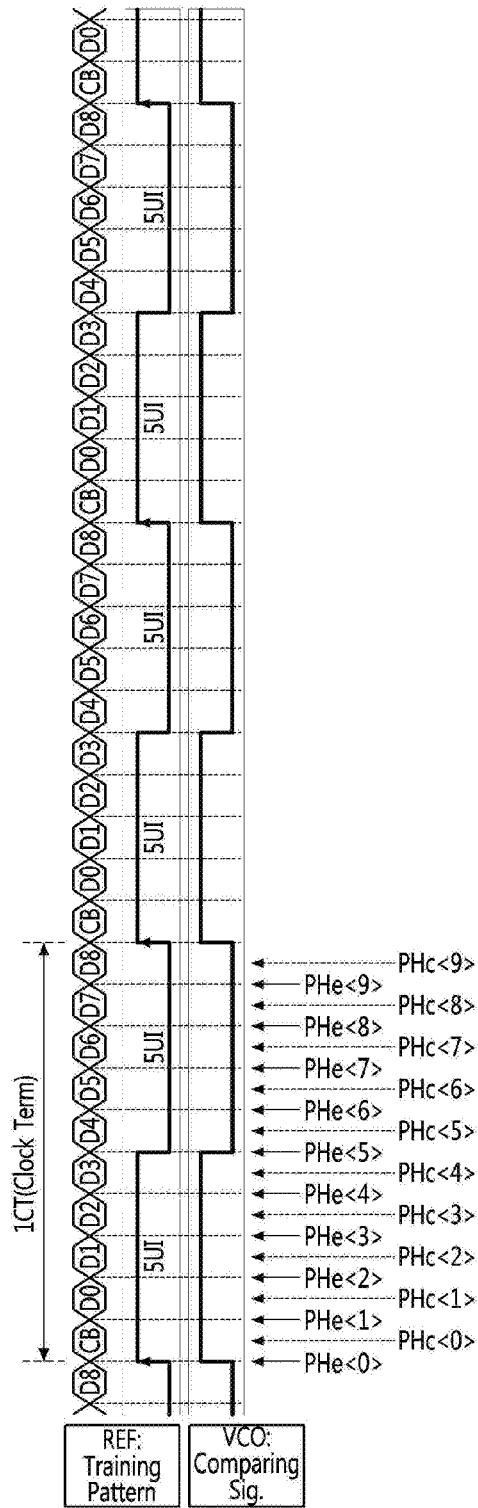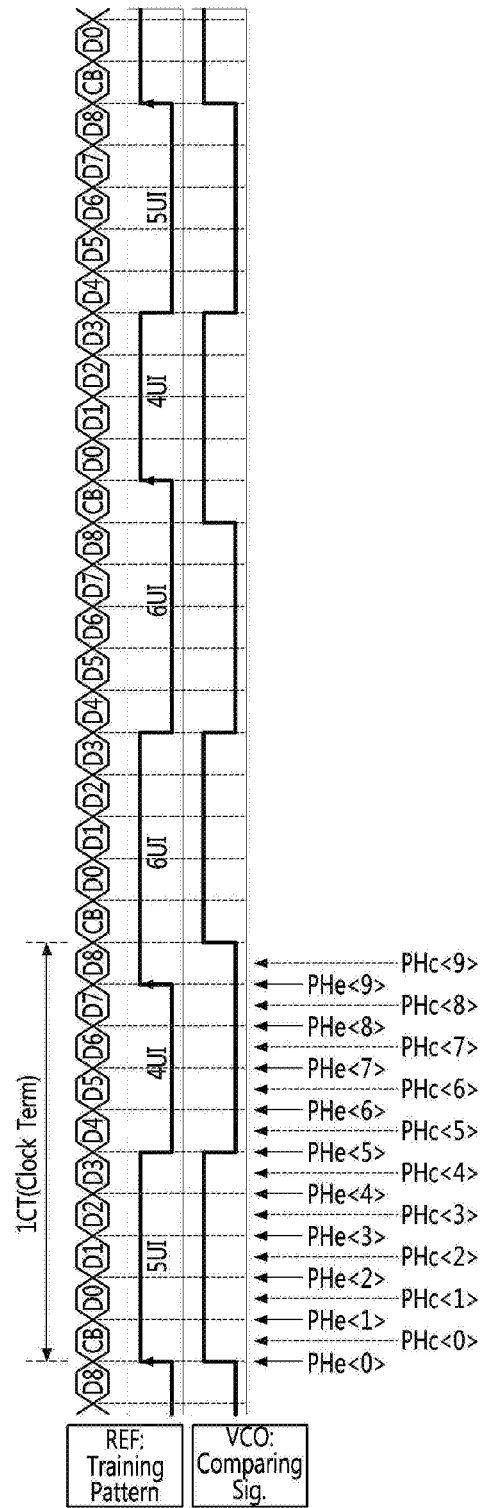

DISPLAY APPARATUS AND DRIVING METHOD FOR THE SAME

CROSS-REFERENCE TO RELATED APPLICATIONS

This application claims priority to Korean Patent Application No. 10-2015-0023603 filed on Feb. 16, 2015 in the Korean Intellectual Property Office (KIPO), the entire contents of which are hereby incorporated by reference.

BACKGROUND

1. Technical Field

The present disclosure relates to a display apparatus and a driving method for the same, and more particularly to a timing controller and a phase locked loop (PLL) constituting a display apparatus, and a method for generating reference signals for the same.

2. Related Art

A timing controller is a semiconductor device for enhancing picture quality of a display panel used for a display apparatus such as a Liquid Crystal Display (LCD) monitor, a laptop computer, a television and a large size display panel. It is also referred to as a 'T-con', and controls the amount of data to be transmitted to a display driver integrated circuit (DDI). That is, the timing controller is a chip device controlling DDIs for respective channels of the display panel and is referred to as a central processing unit (CPU) of the display panel.

A reduced swing differential signaling (RSDS) or a mini low voltage differential signaling (LVDS) have been widely used as an interfacing protocol between the timing controller and the DDI. However, they need a plurality of signaling wires and have difficulties in achieving high-speed data transmission.

In order to resolve the above-described shortcomings, an Advanced Intra Panel Interface (AiPi+) and a Unified Standard Interface TV (USI-T) have been developed, and they can decrease the number of necessary signaling wires and facilitate high-frequency operations.

However, even when the AiPi+ transmission manner is used, an effect of electromagnetic interference (EMI) may increase and the amount of power consumption according to the many number of stages in a voltage controller oscillator (VCO) in PLL of the DDI may significantly increase. Also, even when the USI-T transmission manner is used, the problem of large power consumption according to the many number of stages in VCO of PLL still remain.

SUMMARY

Accordingly, exemplary embodiments of the present invention are provided to substantially obviate one or more problems due to limitations and disadvantages of the related art.

Exemplary embodiments according to the present disclosure provide apparatuses of generating a reference signal having a training pattern which can reduce power consumption in a PLL, and methods for the same.

Also, exemplary embodiments according to the present disclosure provide an apparatus for receiving a reference signal having a training pattern which can reduce power consumption in a PLL.

In order to achieve the objectives of the present invention, a method for generating a reference signal may comprise generating a reference signal having a training pattern being repeated with a periodicity of two clock terms (CTs); and transmitting the reference signal to a phase locked loop (PLL). In the method, each CT has an embedded clock bit (CB) and a plurality of data bits. Also, in a single period, the reference signal has a rising edge at a start point of a first CB corresponding to a first unit interval (UI) of a first CT, and a rising edge at an end point of a second CB corresponding to a first UI of a second CT.

Here, the first CT may comprise five UIs in high state and five UIs in low state. Also, first to fifth UIs of the first CT may be in high stage and sixth to tenth UIs of the first CT may be in low state.

Here, the second CT may comprise four UIs in high state and six UIs in low state. Also, a first UI and sixth to tenth UIs of the second CT may be in low state, and second to fifth UIs of the second CT may be in high state.

In order to achieve the objectives of the present invention, an apparatus for timing control may comprise a generating part generating a reference signal having a training pattern being repeated with a periodicity of two clock terms (CTs); and a transmitting part transmitting the reference signal to a phase locked loop (PLL). In the apparatus, each CT may have and embedded clock bit (CB) and a plurality of data bits. Also, in a single period, the reference signal may have a rising edge at a start point of a first CB corresponding to a first unit interval (UI) of a first CT, and a rising edge at an end point of a second CB corresponding to a first UI of a second CT.

Here, the first CT may comprise five UIs in high state and five UIs in low state.

Here, the second CT may comprise four UIs in high state and six UIs in low state.

In order to achieve the objectives of the present invention, a phase locked loop (PLL) apparatus may comprise a phase detector detecting a phase difference between a reference signal obtained from a timing controller and a clock signal; a charge pump generating a current based on the detected phase difference; and a voltage controller oscillator (VCO) outputting a pulse signal having a frequency corresponding to the generated current. Here, the reference signal has a training pattern being repeated with a periodicity of two clock terms (CTs) each of which comprises a single embedded clock bit (CB) and a plurality of data bits. Also, in a single period, the reference signal has a rising edge at a start point of a first clock bit (CB) corresponding to a first unit interval (UI) of a first CT, and a rising edge at an end point of a second CB corresponding to a first UI of a second CT.

Here, the VCO may have 10 or less stages.

Here, the first CT may comprise five UIs in high state and five UIs in low state.

Here, the second CT may comprise four UIs in high state and six UIs in low state.

According to exemplary embodiments of the present disclosure, energy consumption and EMI effects can be remarkably reduced through use of a reference signal having a new training pattern. Also, the number of stages in VCO can be reduced without additional devices for PLL such that a complexity of PLL can be decreased.

BRIEF DESCRIPTION OF DRAWINGS

Exemplary embodiments of the present invention will become more apparent by describing in detail exemplary embodiments of the present invention with reference to the accompanying drawings, in which:

FIG. 1 is a timing diagram of a reference signal having a training pattern based on the AiPi+ transmission manner;

FIG. 2 is a timing diagram of a reference signal having a training pattern based on the USI-T transmission manner;

DETAILED DESCRIPTION

Figure 3:
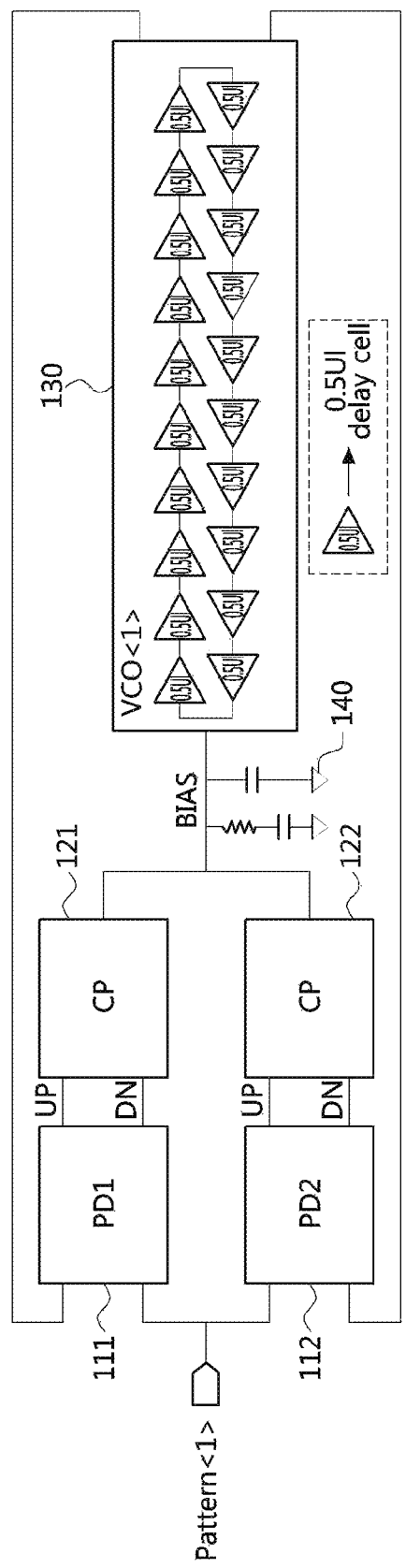
FIG. 3 is a block diagram of a phase locked loop (PLL) receiving the reference signal having the training pattern of FIG. 1.

Example embodiments of the present invention are disclosed herein. However, specific structural and functional details disclosed herein are merely representative for purposes of describing example embodiments of the present invention, however, example embodiments of the present invention may be embodied in many alternate forms and should not be construed as limited to example embodiments of the present invention set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" with another element, it can be directly connected or coupled with the other element or intervening elements may be present. In contrast, when an element is referred to as being "directly connected" or "directly coupled" with another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present invention will be described in detail with reference to the appended drawings. In the following description, for easy understanding, like numbers refer to like elements throughout the description of the figures, and the same elements will not be described further.

FIG. 1 is a timing diagram of a reference signal having a training pattern based on the AiPi+ transmission manner.

Referring to FIG. 1, a rising edge of the reference signal exists only at a constant position (e.g., an edge between a data bit (D8) and a clock bit (CB)). In this case, an electromagnetic interference (EMI) effect may increase. Also, when a voltage controller oscillator (VCO) is used for a phase locked loop (PLL), or when a voltage controller delay line (VCDL) is used for a delay locked loop (DLL), the number of stages needed for VCO or VCDL increases such that the amount of power consumption increases.

FIG. 2 is a timing diagram of a reference signal having a training pattern based on the USI-T transmission manner.

Referring to FIG. 2, rising edges of the reference signal waves from edges between D8 and CB by a single unit interval (UI) with a periodicity of three clock terms. For example, a first rising edge of the reference signal occurs at a point between D8 and CB, a second edge of the reference signal occurs at a point a single UI earlier than a point between D8 and CB (i.e., at a point between D7 and D8), and a third edge of the reference signal occurs at a point a single UI later than a point between D8 and CO (i.e., at a point between CB and DO). In this case, there is an advantage of reducing EMI effects among the shortcomings of the AiPi+. However, since the number of stages of VCO in PLL still cannot be decreased, the problem of large power consumption still remains.

The conventional reference signals output both of data edge phase clock (PHe) signals and data center phase clock (PHc) signals through the training patterns illustrated in FIG. 1 and FIG. 2. Such the signal transmission manners may generate unnecessary signals, PHe signals, and thus the number of stages of VCO in PLL should be increased.

FIG. 3 is a block diagram of a phase locked loop (PLL) receiving the reference signal having the training pattern of FIG. 1.

Referring to FIG. 1, a first phase detector (PD1) 111 and a second phase detector (PD2) 112 may receive a reference signal having a pattern <1> and outputs of a VCO 130, compare phases of the two signals, and output UP signals or DN signals by determining whether the output signal of the VCO is faster or slower than the reference signal. Here, the VCO receives a voltage and outputs a pulse signal having a frequency corresponding to the input voltage. Also, a charge pump (CP) 121 or 122 receives the output (UP or DN) of the PD1 or PD2, and generates a sinking current or a sourcing current corresponding to the length of the UP or DN signal. Then, this current may be converted to a voltage which becomes an input voltage to the VCO 130 through a Resistor-Inductor-Capacitor (RLC) filter 140. Through the above-described operations, the reference signal and the output signal of the VCO 130 may have the same frequency and the same phase.

As illustrated in FIG. 3, according to PHc signals and PHe signals for the reference signal of FIG. 1, the VOC 130 should have 20 stages.

Hereinafter, an exemplary embodiment for a method for generating a reference signal having a training pattern which can resolve the above-described problem and a PLL which receives the reference signal will be described.

Figure 4:
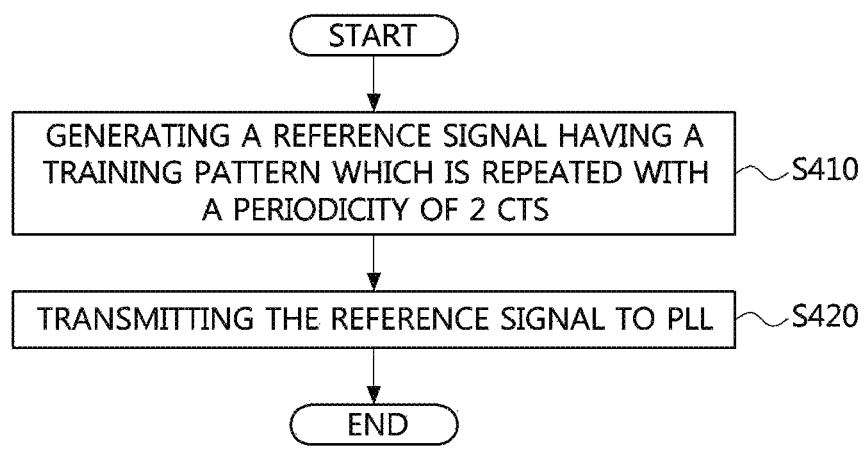
FIG. 4 is a flow chart illustrating a method for generating a reference signal according to an exemplary embodiment of the present disclosure.
Figure 5:
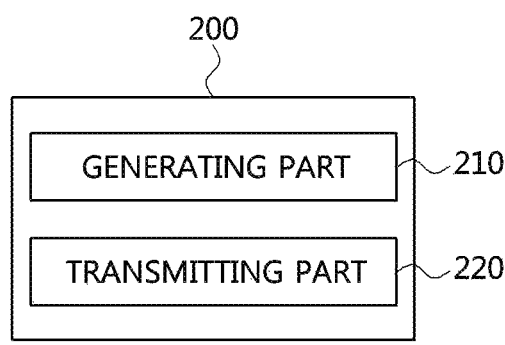
FIG. 5 is a block diagram illustrating a timing controller performing a method for generating a reference signal according to an exemplary embodiment of the present disclosure.

FIG. 4 is a flow chart illustrating a method for generating a reference signal according to an exemplary embodiment of the present disclosure, and FIG. 5 is a block diagram illustrating a timing controller performing a method for generating a reference signal according to an exemplary embodiment of the present disclosure.

Referring to FIG. 4 and FIG. 5, a timing controller 200 may comprise a generating part 210 and a transmitting part 220. The generating part 210 may generate a reference signal, and the transmitting part 220 may transmit the generated reference signal to a PLL.

First, the generating part 210 of the timing controller 200 may generate a reference signal having a training pattern which is repeated with a periodicity of two clock terms (CTs) (S410).

Figure 6:
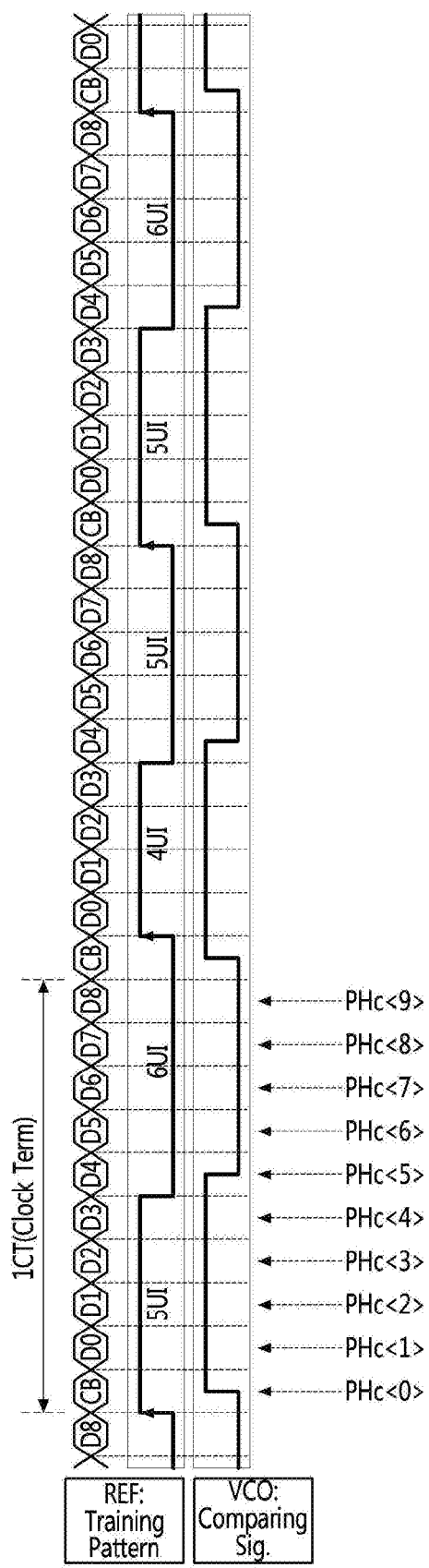
FIG. 6 is a timing diagram of a reference signal having a training pattern according to an exemplary embodiment of the present disclosure.

FIG. 6 is a timing diagram of a reference signal having a training pattern according to an exemplary embodiment of the present disclosure.

Referring to FIG. 6, a reference signal may have, in a single period (comprising two CTs), a rising edge at a start point of a first CB corresponding to a first unit interval (UI) of a first CT, and a rising edge at an end point of a second CB corresponding to a first UI of a second CT. Also, such the period may be repeated.

That is, for a data signal comprising data bits D0 to D9 and an embedded clock bit CB, a first rising edge of a high signal of the reference signal may be generated at a start point of a first CB, and a second rising edge of the high signal of the reference signal may be generated at an end point of a second CB. Also, this pattern may be repeated in the training pattern.

In addition, various exemplary embodiments, in which the rising edges are generated at a start point and an end point of CB and a single falling edge is generated between the two rising edge, may be possible.

In an exemplary embodiment, referring to FIG. 6, the first CT may comprise five UIs in high state and five UIs in low state, and the second CT may comprise four UIs in high state and six UIs in low state.

For example, in the first CT, first to fifth UIs may be in high state, and sixth to tenth UIs may be in low state. In the second CT, the first UI may be in low state, second to fifth UIs may be in high state, and sixth to tenth UIs may be in low state.

Then, the transmitting part may transmit the generated reference signal to the PLL (S420). Also, the PLL may match the inputted reference signal to a clock signal.

Figure 7:
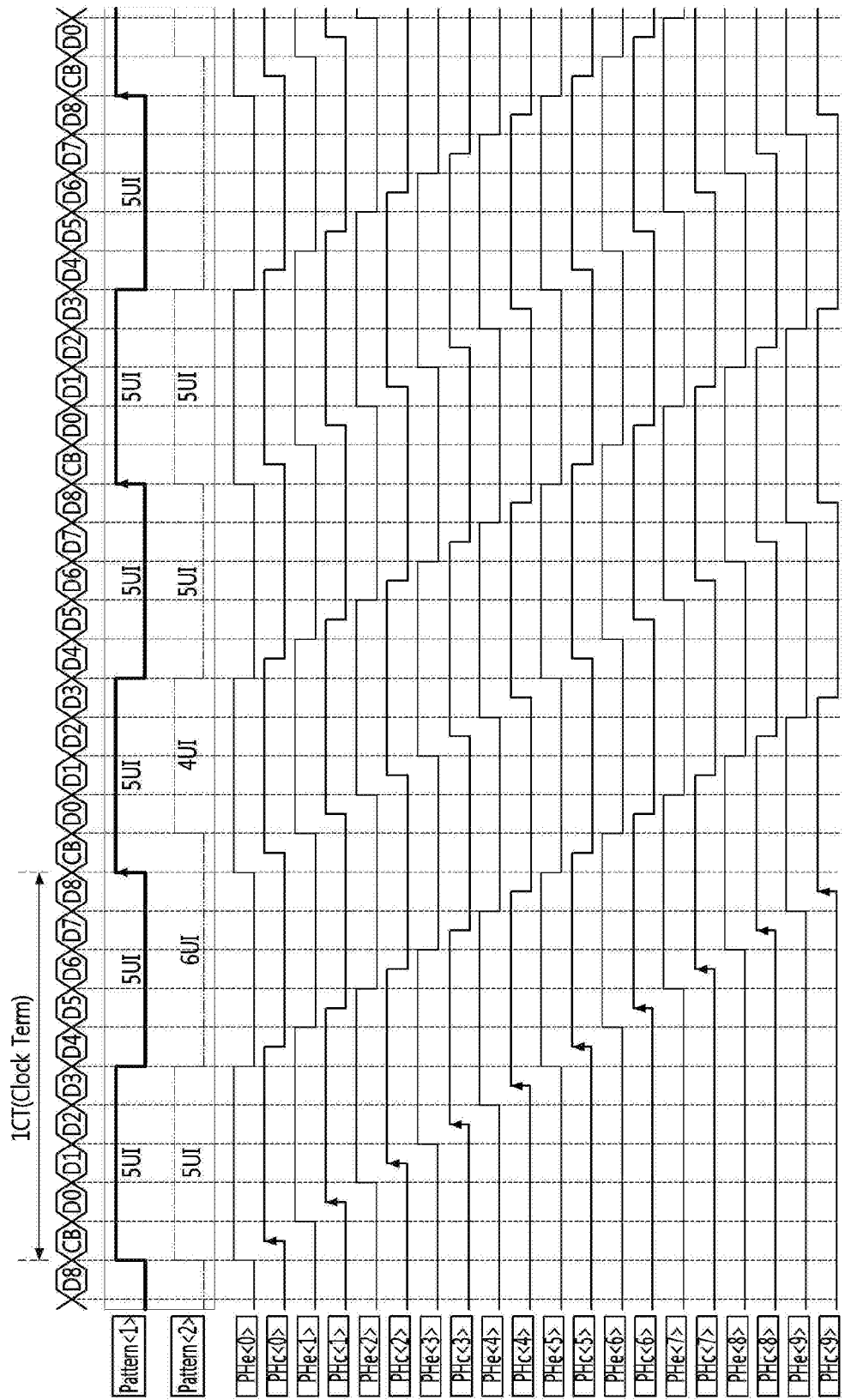
FIG. 7 is a timing diagram illustrating a multi-phase clock outputted by a PLL.

FIG. 7 is a timing diagram illustrating a multi-phase clock outputted by a PLL.

For the reference signal according to the conventional technologies, totally 20 output signals including PHc signals and PHe signals may be generated. However, for the reference signal according to an exemplary embodiment of the present disclosure, only PHc signal may be generated as the output signal. Here, the PHe signal may be unnecessary signals, and cause the number of stages in PLL to increase.

Referring to FIG. 7, a pattern <1> is a training pattern according to the conventional technology. In the case that such the reference signal is inputted, the PLL may output both of the PHe signals and the PHc signals. On the contrary, in the case that a pattern <2> which is the reference signal according to the present disclosure is inputted, the PLL may output only PHc signals.

Figure 8:
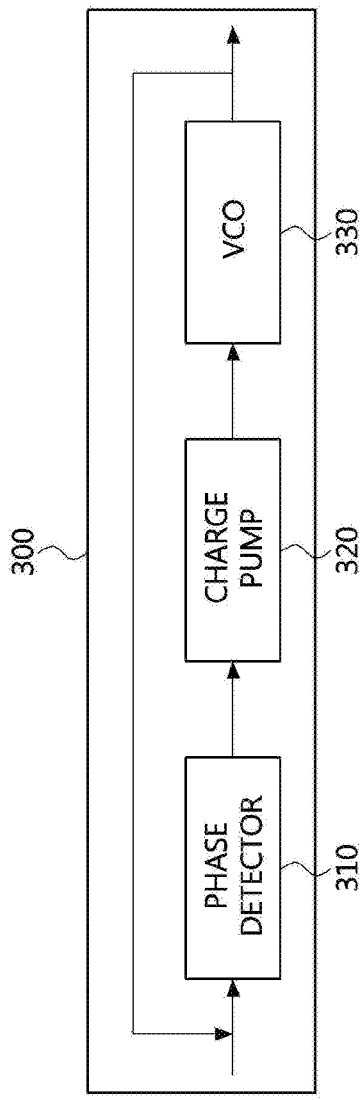
FIG. 8 is a block diagram of a conventional PLL.

FIG. 8 is a block diagram of a conventional PLL.

Referring to FIG. 8, a PLL 300 may comprise a phase detector 310, a charge pump 320, and a VCO 330.

The phase detector 310 may detect a phase difference between a reference signal obtained from a timing controller and a clock signal, the charge pump 320 may generate a current corresponding to the detected phase difference, and the VCO 330 may output a pulse signal having a frequency corresponding to the generated current.

Also, through feedback of the output of the VCO 330, the frequencies and phases of the two signals may be matched to each other. In this procedure, since the VOC 330 should process Pile signals and PHe signals, the VCO 330 is required to have as many stages as output signals.

Figure 9:
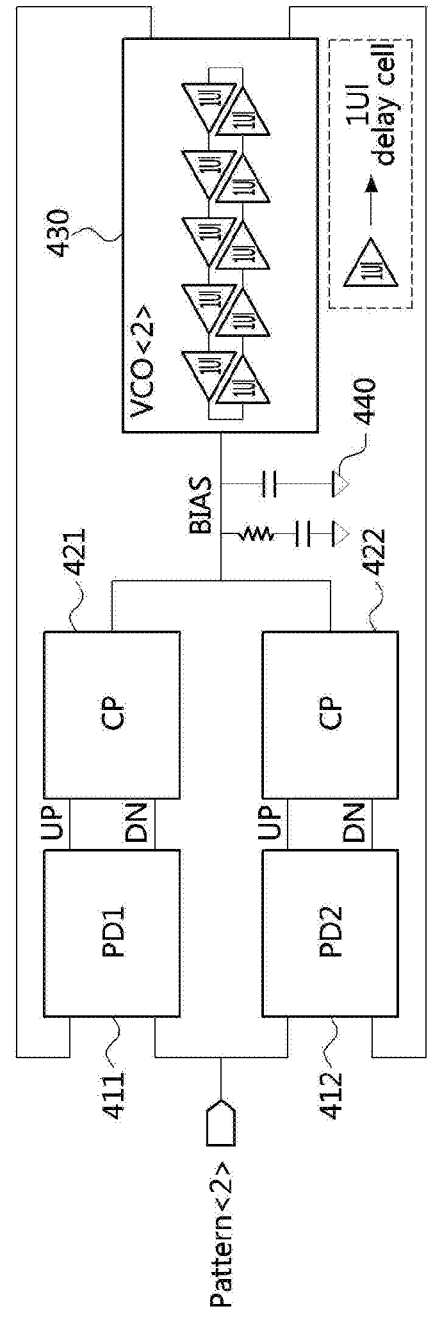
FIG. 9 is a block diagram of a PLL receiving a reference signal having a training pattern according to an exemplary embodiment of the present disclosure.

FIG. 9 is a block diagram of a PLL receiving a reference signal having a training pattern according to an exemplary embodiment of the present disclosure.

Referring to FIG. 9, only PHc signals of rising edges may be detected in a VCO 430 of a PLL 400, and PHe signals may be canceled.

Referring to FIG. 3 and FIG. 9, a difference between the number of stages in the VCO 130 and the number of stages in the VCO 430 may be identified. That is, the number of stages needed in the VOC 430 may be reduced according to that PHe signals are removed.

FIG. 3 illustrates a structure of a PLL 300 receiving a reference signal <1> having a conventional training pattern. As illustrated in FIG. 3, the number of stages in the VCO 130 may be 20 when 0.5 UI delay cells are used for the VCO 130.

FIG. 9 illustrates a structure of a PLL 400 receiving a reference signal <2> having a training pattern according to the present invention. As illustrated in FIG. 9, the PLL 400 has 10 stages when 1 UI delay cells are used for the VCO 430. Here, a component 440 is a RLC filter.

That is, if the training pattern of the reference signal is identical to the pattern <2> of FIG. 7, only PHc signals of waving rising edges are detected in the comparing signal of the VOC 330, and unnecessary PHe signals may be canceled.

Through this, the number of stages in the VCO 430 may be reduced to a half of the number of stages in the VCO 130 of the conventional PLL 100.

Here, the reference signal has the training pattern which is repeated with a periodicity of 2 CTs. Also, the training pattern has a rising edge at the start point of first UI included in the first CT in a period, and a rising edge at the start point of the second UI included in the second CT in the period.

As described above, according to the present invention, only PHc signals may be detected without generation of unnecessary PHe signals, whereby the number of stages in VCO of PLL can be reduced to a half of that of the conventional PLL and thus energy consumption can be reduced.

According to exemplary embodiments of the present disclosure, energy consumption and EMI effects can be remarkably reduced through use of a reference signal having a new training pattern. Also, the number of stages in VCO can be reduced without additional devices for PLL such that a complexity of PLL can be decreased.

While the example embodiments of the present invention and their advantages have been described in detail, it should be understood that various changes, substitutions and alterations may be made herein without departing from the scope of the invention.

What is claimed is:

1. A method for generating a reference signal, performed in a timing controller of a display apparatus, the method comprising:
   generating a reference signal having a training pattern being repeated with a periodicity of two clock terms (CTs); and
   transmitting the reference signal to a phase locked loop (PLL),
      wherein each CT has an embedded clock bit (CB) and a plurality of data bits, and
      wherein, in a single period, the reference signal has a rising edge at a start point of a first CB corresponding to a first unit interval (UI) of a first CT, and a rising edge at an end point of a second CB corresponding to a first UI of a second CT,
      in a high state included in the first CT is different from a number of UIs in a high state included in the second CT,
      wherein a number of UIs in a low state included in the first CT is different from a number of UIs in a low state included in the second CT, and
      wherein a signal level of the first UI of the first CT is different from a signal level of the first UI of the second CT.

2. The method according to claim 1, wherein the first CT comprises five UIs in high state and five UIs in low state.

3. The method according to claim 2, wherein first to fifth UIs of the first CT are in high stage and sixth to tenth UIs of the first CT are in low state.

4. The method according to claim 1, wherein the second CT comprises four UIs in high state and six UIs in low state.

5. The method according to claim 4, wherein a first UI and sixth to tenth UIs of the second CT are in low state, and second to fifth UIs of the second CT are in high state.

6. An apparatus for timing control, the apparatus comprising:
   a generating processor generating a reference signal having a training pattern being repeated with a periodicity of two clock terms (CTs); and
   a transmitting processor transmitting the reference signal to a phase locked loop (PLL),
      wherein each CT has an embedded clock bit (CB) and a plurality of data bits, and
      wherein, in a single period, the reference signal has a rising edge at a start point of a first CB corresponding to a first unit interval (UI) of a first CT, and a rising edge at an end point of a second CB corresponding to a first UI of a second CT,
      wherein a number of unit interval (UI) in a high state included in the first CT is different from a number of UIs in a high state included in the second CT,
      wherein a number of UIs in a low state included in the first CT is different from a number of UIs in a low state included in the second CT, and
      wherein a signal level of the first UI of the first CT is different from a signal level of the first UI of the second CT.

7. The apparatus according to claim 6, wherein the first CT comprises five UIs in high state and five UIs in low state.

8. The apparatus according to claim 6, wherein the second CT comprises four UIs in high state and six UIs in low state.

9. A phase locked loop (PLL) apparatus comprising:
   a phase detector detecting a phase difference between a reference signal obtained from a timing controller and a clock signal;
   a charge pump generating a current based on the detected phase difference; and
   a voltage controller oscillator (VCO) outputting a pulse signal having a frequency corresponding to the generated current,
      wherein the reference signal has a training pattern being repeated with a periodicity of two clock terms (CTs) each of which comprises a single embedded clock bit (CB) and a plurality of data bits,
      wherein, in a single period, the reference signal has a rising edge at a start point of a first clock bit (CB) corresponding to a first unit interval (UI) of a first CT, and a rising edge at an end point of a second CB corresponding to a first Ul of a second CT,
      wherein a number of unit interval (UI) in a high state included in the first CT is different from a number of UIs in a high state included in the second CT,
      wherein a number of UIs in a low state included in the first CT is different from a number of UIs in a low state included in the second CT, and
      wherein a signal level of the first Ul of the first CT is different from a signal level of the first UI of the second CT.

10. The apparatus according to claim 9, wherein the VCO has 10 or less stages.

11. The apparatus according to claim 9, wherein the first CT comprises five UIs in high state and five UIs in low state.

12. The apparatus according to claim 9, wherein the second CT comprises four UIs in high state and six UIs in low state.

* * * * *